United States Patent
Burt et al.

(10) Patent No.: US 6,444,968 B1
(45) Date of Patent: Sep. 3, 2002

(54) CCD IMAGER WITH SEPARATE CHARGE MULTIPLICATION ELEMENTS

(76) Inventors: David James Burt, 21 Garth Road, London NW2 2NH (GB); Raymond Thomas Bell, 4 Alton Avenue, Stanmore, Middlesex HA7 3PQ (GB)

( * ) Notice: Subject to any disclaimer, the term of this patent is extended or adjusted under 35 U.S.C. 154(b) by 0 days.

(21) Appl. No.: 09/715,029

(22) Filed: Nov. 20, 2000

Related U.S. Application Data

(63) Continuation of application No. 09/045,826, filed on Mar. 23, 1998, now abandoned.

(30) Foreign Application Priority Data

Mar. 22, 1997 (GB) .............................................. 9705986

(51) Int. Cl.⁷ .............................................. H01L 27/00
(52) U.S. Cl. ...................................... 250/208.1; 348/303
(58) Field of Search ....................... 250/208.1, 214 LA, 250/214 R; 348/294–298, 314–317, 303; 257/239, 292–294, 448

(56) References Cited

U.S. PATENT DOCUMENTS

| | | |
|---|---|---|
| 3,761,744 A | 9/1973 | Smith |
| 4,796,071 A | 1/1989 | Imaide |
| 5,236,871 A * | 8/1993 | Fossum et al. ............. 437/195 |
| 5,337,340 A | 8/1994 | Hynecek |
| 5,665,959 A | 9/1997 | Fossum et al. |

FOREIGN PATENT DOCUMENTS

| | | |
|---|---|---|
| JP | 63-86672 | 4/1988 |
| JP | 05-335549 | 12/1993 |

* cited by examiner

Primary Examiner—Que T. Le
(74) Attorney, Agent, or Firm—Venable; Robert Kinberg; Jeffri A. Kaminski

(57) ABSTRACT

In a CCD imager, a charge is accumulated in pixels of an image area representative of the intensity of incident radiation and is subsequently transferred to a store section and then on a row by row basis to an output register by applying suitable drive pulses to drive electrodes. Signal charge in the output register is transferred to a multiplication register by drive pulses applied to drive electrodes to give charge transfer in the direction shown by the arrows. One or more drive pulses applied to the electrodes of the multiplication register are of sufficiently large amplitude to produce high field regions in the register element to cause signal multiplication by impact ionisation. This gives a low noise amplification of the signal charge, the multiplied signal charge being detected at charge detection circuit.

31 Claims, 5 Drawing Sheets

CCD IMAGER WITH SEPARATE CHARGE MULTIPLICATION ELEMENTS

This application is a continuation of Ser. No. 09/045,826 filed Mar. 23, 1998, now abandoned.

FIELD OF THE INVENTION

This invention relates to charge coupled devices (CCDs) and more particularly to an output circuit for a CCD imager.

BACKGROUND TO THE INVENTION

In a typical CCD imager, signal charge representative of incident radiation is accumulated in an array of pixels in an image area. Following an integration period, signal charge is transferred to an output register by applying appropriate clocking or drive pulses to control electrodes. The signal charge is then read out from the output register and applied to a charge detection circuit to produce a voltage which is representative of the amount of signal charge.

In a paper by Hynecek entitled "CCM-A New Low-Noise Charge Carrier Multiplier Suitable For Detection Of Charge In Small Pixel CCD Image Sensors" IEEE Trans. Of Electron Devices Vol. 39, No. 8, pp 1972–1975, August 1992, a proposal is made to multiply charge carriers within the CCD image area during the transfer process as signal charge is clocked from pixel to pixel to the output register. The suggested technique involves establishing large electric fields in the semiconductor material beneath pairs of control electrodes which in conventional operation are controlled to collect and move signal charge through the CCD elements. The required large fields may be obtained by using a large difference in drive voltages applied to adjacent CCD control electrodes during the transfer process. Signal charge carriers are thus accelerated to sufficiently high velocities by the large field regions that, on transfer between regions under the control electrodes, additional carriers are generated through impact ionisation. Although the charge multiplication per transfer is generally low, typically up to 1%, a usefully large signal gain may be achieved because of the large number of transfers normally required for signal readout in a practical device. As the additional noise associated with the multiplication process is low, the increased signal level gives an improvement in the overall signal-to-noise ratio of the detector. The concept of carrier multiplication is also known in other types of solid state detectors, such as avalanche photodiodes, for example.

The present invention seeks to provide a CCD in which charge multiplication can be implemented giving several advantages over the previously proposed technique.

SUMMARY OF THE INVENTION

According to the invention, there is provided a CCD imager comprising: an image area, an output register which receives signal charge from the image area, a separate multiplication register into which signal charge from the output register is transferred, and means for obtaining signal charge multiplication by transferring the charge through a sufficiently high field region in elements of the multiplication register.

An advantage of employing the present invention is that charge multiplication is carried out in a region separate from the conventional CCD structure, such as the image area or a store region, and is conveniently an extended section of the CCD output register. Thus the multiplication register and its operation may be optimised without taking into account the parameters and structure required for the conventional functioning of the CCD imager, and no adaption of those parameters or structure is required to implement carrier multiplication. In the previously proposed arrangement, carrier multiplication occurs within the existing active structure of the device but this structure must simultaneously also be optimised for parameters such as dark current, quantum efficiency and peak signal level, placing constraints on design and operation, and requiring compromises.

Another advantage of the present invention is that it is applicable to any type of CCD architecture, such as for example, one using inter-line transfer.

The charge received by the output register from the image area may be transferred directly or via an intermediate store region, for example. Similarly, although preferably the signal charge is directly transferred from the output register to the multiplication register there may be other intervening structure.

For some applications the electrical field produced in the elements of the multiplication register to achieve signal charge multiplication may be varied in magnitude with time and/or in dependence on the position of elements in the register but in general, for those elements at which multiplication is required, the same field is produced.

In a particularly advantageous embodiment of the invention, signal charge is transferred in series from the output register through each element of the multiplication register. This avoids possible column-to-column gain variation, essentially a fixed pattern noise, which might occur in the normal image area and store regions of the CCD in the previously proposed technique. However, it may be appropriate in some applications to associate each element of the output register with a respective different multiplication section. This would in effect result in a multiplication register formed as an array in separate columns. This may lead to column-to-column gain variations however and would also reduce the amount of multiplication available for the same amount of space which is occupied by the multiplication register. It would give some advantages over the previously proposed approach as carrier multiplication is carried out in a region separate from the normal active CCD regions.

Use of the invention enables the same multiplication factor to be applied to signal charge accumulated in each pixel of the image area, whereas in the technique proposed by Hynecek the amount of multiplication is dependent on the location of signal charge in the image area, that charge undergoing more transfers to move it to the output register being multiplied by a correspondingly large amount.

It is preferred that a sufficiently high electrical field is produced in each element of the multiplication register to achieve the required signal charge multiplication. However, in some arrangements, it may be appropriate to produce the required electrical field in only some of the available elements in the multiplication register.

The number of elements in the multiplication register is not critical and can be chosen to give a useful increase in signal-to-noise ratio. A sufficiently large number of elements may achieve photon counting performance, that is, achieving sufficient low noise multiplication that the numbers of photons generating electron-hole pairs in each pixel may be unambiguously determined by the signal charge detected at the output.

In an advantageous embodiment of the invention, the number of elements of the multiplication register is approximately an integral multiple of the number of elements of the output register. The integral multiple may be one or more and by "approximately" it is meant that the number of multiplication register elements is only a few more or less than the number of elements, or a multiple thereof, of the output register such that both the output register and the multiplication register can be read out at the same rate. It is particularly preferred that means are included for synchronising signal read out from the multiplication register with the line timing of a television rate signal. Where the multiplication register section has approximately the same number of elements as the output register, or a multiple greater than 1 thereof, it allows device operation to be synchronised with the normal active line periods. Parallel transfer of any line of signal charges from an adjacent store region of the CCD to the output register takes place during the TV line-blanking intervals. These charges are then serially transferred from the output register to the multiplication register during the normal active TV line period whilst, at the same time, the previous line of charges that had been transferred to the multiplication register and temporarily held during the line-blanking interval is transferred to the charge detection circuit to give a signal output. All transfer through the multiplication register, whether during the transfer-in or the transfer-out operation from that register, may be carried out with charge multiplication, with the magnitude of the multiplication factor controlled as explained below.

In one embodiment of the invention, the amount of signal charge multiplication obtained is controlled by controlling the amplitude of one or more drive pulses applied to the multiplication register to transfer signal charge therethrough. Alternatively, or in addition, the amount of signal charge multiplication obtained is controlled by controlling the level of one or more dc potentials applied to the multiplication register. Thus the multiplication factor is externally controlled using the pulses and/or potentials applied to operate the transfer of charge through the multiplication register, and these pulses and potentials may be different from those used for the conventional part of the CCD.

Preferably, the charge capacity of one or more of the elements of the multiplication register is larger than that of elements of the output register. This enables the higher signal levels resulting from multiplication to be accommodated. The elements of the multiplication register may have the same charge capacity, or the charge capacity for those elements nearer the charge detection circuit may be larger as they can be expected to hold higher charge levels.

Advantageously, signal limiting means may be included to prevent excess signal charge from an element of the multiplication register spreading into another element of the multiplication register. The signal limiting means may be similar to the structures used for anti-blooming in the image area of the device.

An imager in accordance with the invention may have a plurality of output registers associated with respective ones of a plurality of multiplication registers and charge detection circuits to permit read out from different regions of the device.

As in accordance with the present invention a multiplication register is included which is separate from the imaging and storage areas of a conventional CCD imager, it may be used in conjunction with any of the other features associated with high performance CCDs without re-designing the CCD structure itself or affecting other characteristics. For example, a multiplication register may be used in CCDs which are: back-thinned and treated devices for high quantum efficiency, inverted mode devices for low dark current, devices with anti-blooming and/or phosphor coatings, deep depletion devices for improved IR response, or any combination of these features or others.

BRIEF DESCRIPTION OF DRAWINGS

Some ways in which the invention may be performed are now described by way of example with reference to the accompanying drawings, in which.

DESCRIPTION OF PREFERRED EMBODIMENTS

Figure 1:
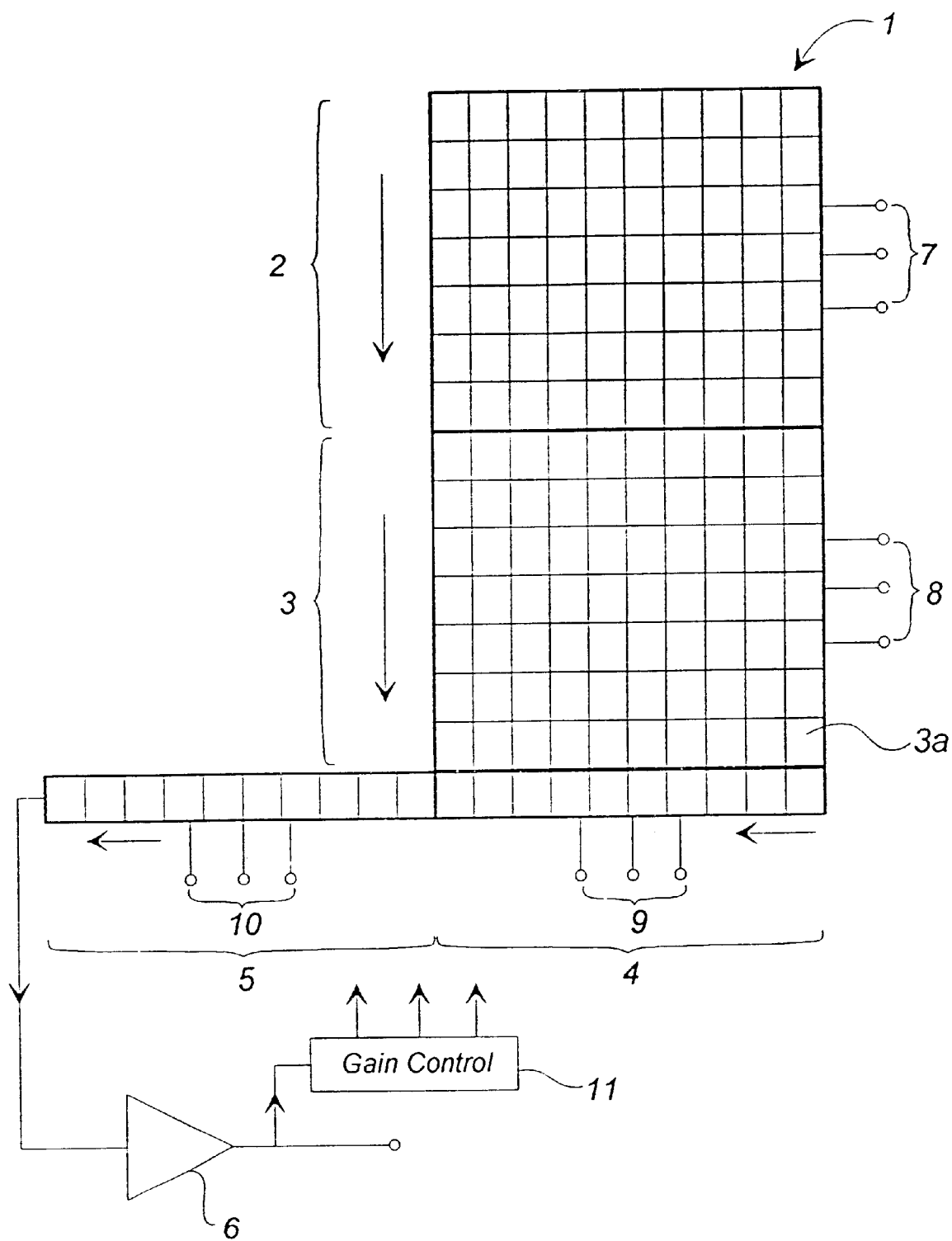
FIG. 1 schematically shows a CCD imager in accordance with the invention.

With reference to FIG. 1, a CCD imager 1 comprises an image area 2, a store section 3 and an output or read-out register 4, each of these components being found in a conventional CCD imager. The output register 4 is extended in a linear direction to give a multiplication register 5, the output of which is connected to a charge detection circuit 6.

During operation of the device, incident radiation is converted at the image area 2 into signal charge which is representative of the intensity of the radiation impinging on the array of pixels making up the image array. Following the image acquisition period, drive pulses are applied to control electrodes 7 to transfer the charge accumulated at the pixels of the image area 2 to the store section 3. Simultaneously with this, drive signals are also applied to control electrodes 8 at the store section 3 to cause charge to be transferred from row to row as indicated by the arrow, the last row of charge held in elements in row 3a being transferred in parallel to the output register 4.

When a row of signal charge has been transferred into the output register 4, appropriate drive pulses are applied to the electrodes 9 to sequentially transfer the charge from the elements of the output register to those of the multiplication register 5. In this embodiment, the multiplication register is of similar architecture to the output register. To achieve multiplication of charge in each of the elements of the multiplication register 5, sufficiently high amplitude drive pulses are applied to control electrodes 10 to both transfer signal charge from one element to the next adjacent element in the direction shown by the arrow and also to increase the level of signal charge by an amount determined by the amplitude of the drive pulses. Thus, as each packet of charge is transferred from one element to the next through the multiplication register, the signal charge increases. The charge detected at circuit 6 is thus a multiplied version of the signal charge collected in the output register 4. At each stage of the multiplication register, the signal charge is increased.

Each signal charge packet stored in the output register 4 undergoes an identical multiplication process as each travels through all the elements of the multiplication register 5.

The output of the charge detection circuit 6 is also applied to an automatic gain control circuit 11 which adjusts the voltages applied to the multiplication register 5 to control the gain. In other embodiments, this feedback arrangement is omitted. Gain may then be controlled manually if desired.

As shown schematically, the multiplication register extends beyond the boundaries of the image area 2, store section 3 and output register 4 but it may in some practical applications be physically parallel and adjacent to the output register 4 to present a more compact structure, although functioning in the same way as the arrangement shown in FIG. 1.

Figure 2A:
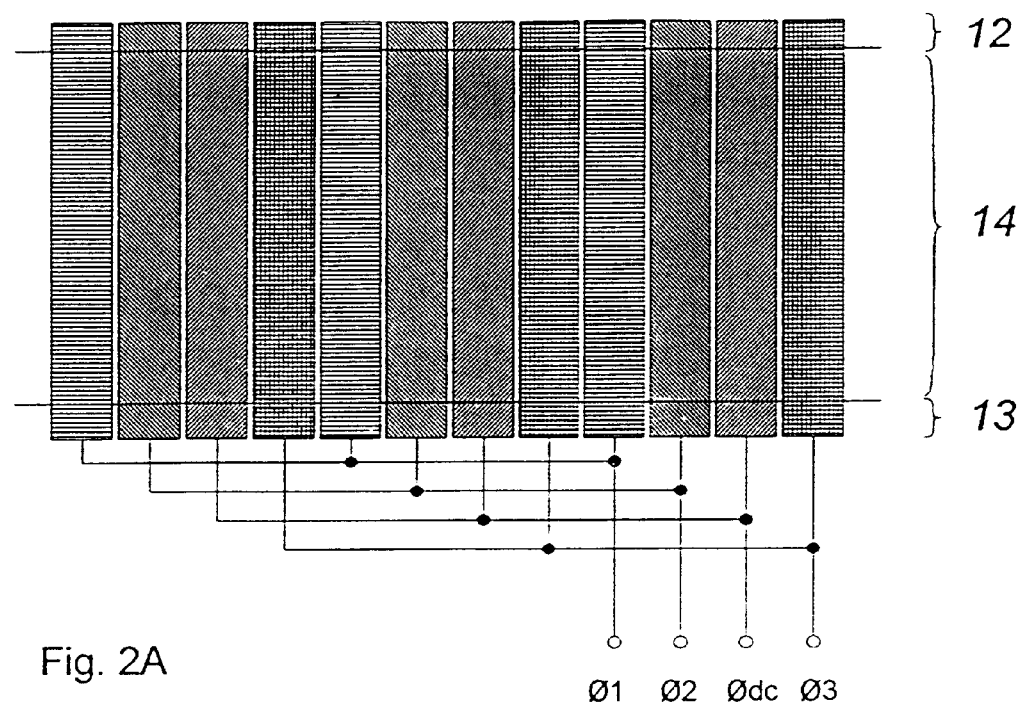
FIG. 2A schematically illustrates part of a simple multiplication register used in the imager of FIG. 1
Figure 2B:
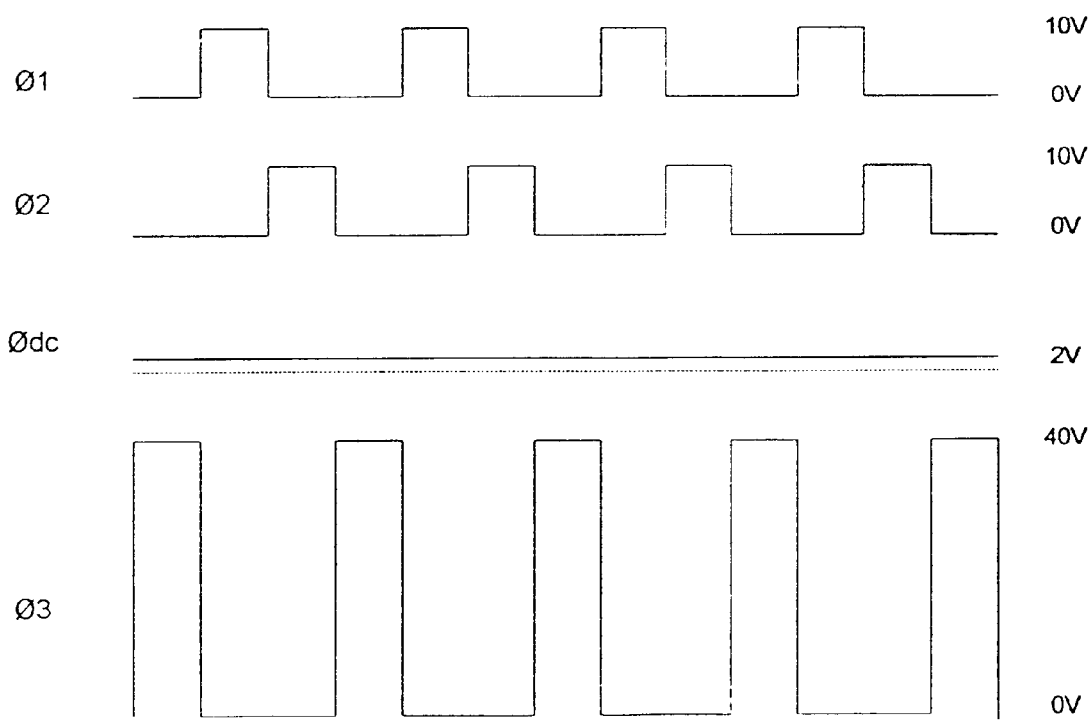
FIG. 2B shows typical drive waveforms used in operating the multiplication register of FIG. 2A.
Figure 3:
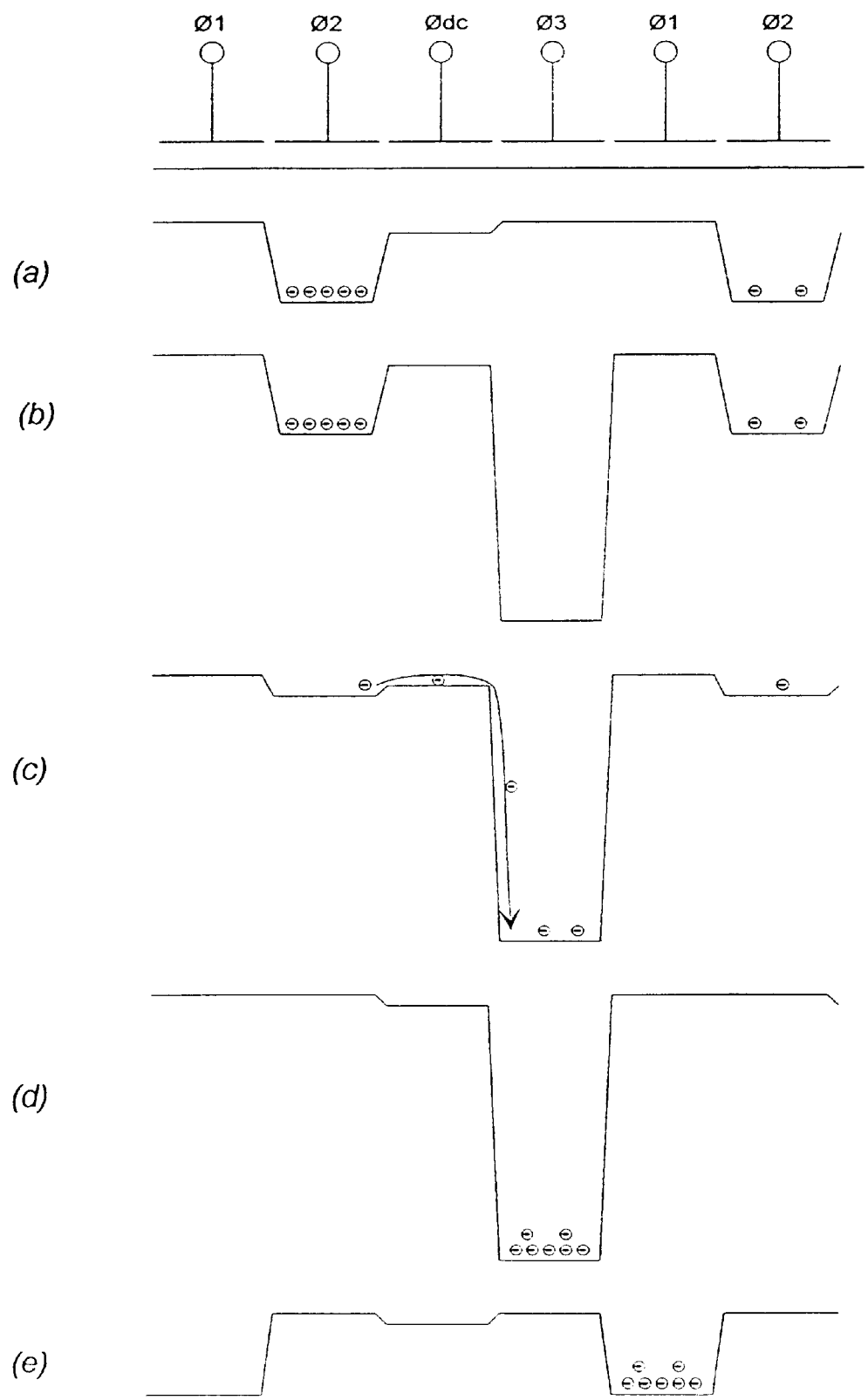
FIG. 3 is an explanatory diagram concerning the formation of a high field region and charge transfer through it.

Part of the multiplication register 5 of FIG. 1 is shown schematically in FIG. 2A and includes "channel stop" isolation regions 12 and 13 with a CCD channel 14 between them. The multiplication register 5 is based on a 3-phase CCD architecture in this case but other embodiments may use 2 or 4 phase architectures, for example. FIG. 2B shows the clock pulses and dc bias voltage applied to the electrodes of the multiplication register 5, the voltages given being by way of example only. The clock pulses for the first and second phase electrodes ø1 and ø2 have an amplitude of 10 volts and the dc potential is maintained at 2 volts. The third phase electrode ø3 is driven from 0 volts to 40 volts to obtain high field regions in the multiplication register 5. FIG. 3 illustrates the effect of the drive waveforms on the operation of multiplication register 5. The electrodes are shown in simplified form in cross section along part of the multiplication register 5. The potential profile under the electrodes and signal charge distribution at various times in the transfer cycle are shown at lines (a) to (e), with potential being shown increasing in a downwards direction.

At line (a) the initial part of the cycle is illustrated in which charge is stored under the second phase electrodes ø2. Subsequent to this, a large voltage clock pulse is applied to the third phase electrodes ø3 to obtain the potential profile shown at (b) resulting in a high field region between each pair of second and third phase electrodes ø2 and ø3. As the clock signal applied to the second phase electrodes ø2 is reduced to zero volts, as shown at (c), charge is transferred through the high field region from beneath the second phase electrodes ø2 to the wells formed under the third phase electrodes ø3. The multiplied charge is then stored under the third phase electrodes ø3 as shown at (d). To complete the cycle, the charge is transferred to beneath first phase electrodes ø1, as shown at (e).

Thus it can be seen that the high electric fields required to achieve avalanche multiplication are generated by having a sufficiently large voltage difference between pairs of adjacent electrodes in each element of the multiplication register. In the illustrated embodiment, a high field region is obtained where one electrode in each pair has a high amplitude (30 to 40 volts) clock pulse applied to it and the adjacent electrode of the pair is maintained at a low dc bias potential. The two additional electrodes of each element have the normal clock pulses of typically 10 volts amplitude applied. The voltage difference between the high level of the high amplitude pulse and the dc bias, typically close to but just above the clock low level, for example, 2 volts, determines the strength of the field. Hence the multiplication factor can be controlled. To adjust the avalanche multiplication factor, either the high level of the high amplitude pulse or the dc bias may be adjusted to vary the field. The low level of the high amplitude clock is typically zero volts as for the normal clock pulses applied to the additional electrodes.

In cases where the device is to be operated at conventional TV rates, the number of multiplication register elements is the same, or approximately the same, as the number of elements in the output register.

In the illustrated embodiment, the elements of the multiplication register 5 have the same charge storage capacity as those of the output register 4. In other embodiments, the charge storage capacity of the multiplication register elements is larger than that of the output register to accommodate the increased signal charge. Those elements nearer the charge detection circuit 6 may have a greater charge storage capacity than those nearer the output register 4.

Figure 4A:
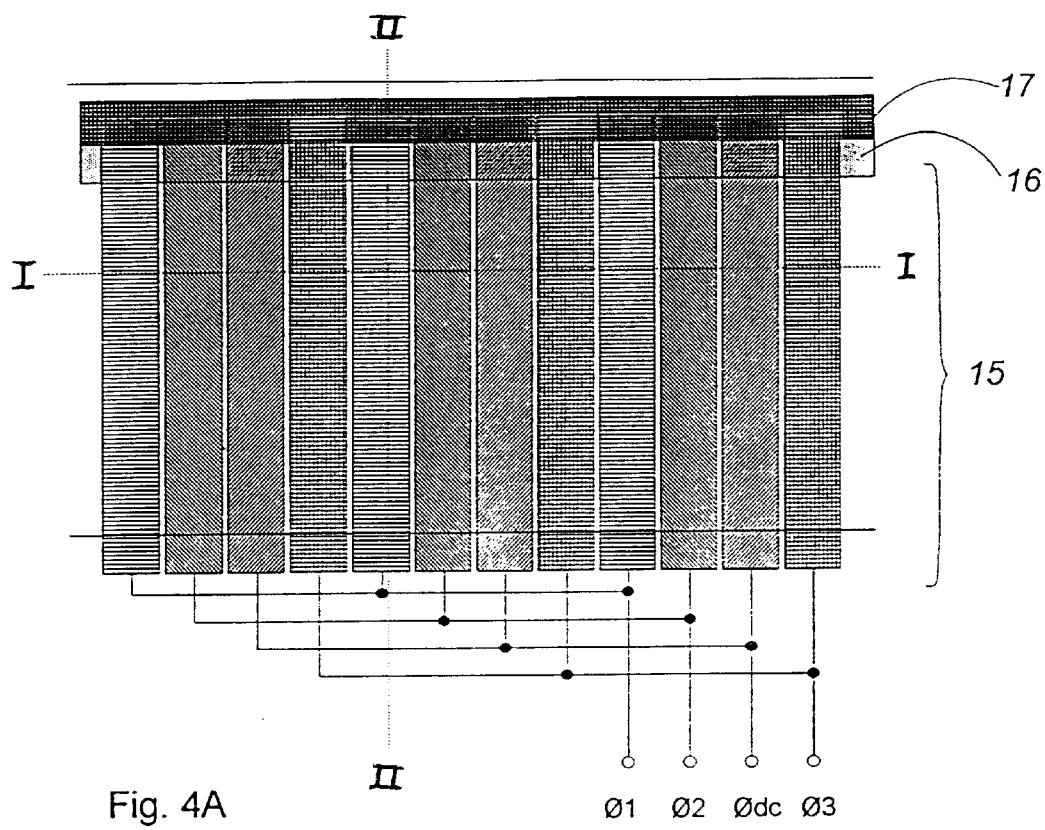
FIG. 4A schematically illustrates part of a multiplication register which includes means for limiting maximum signal charge and FIG. 4B illustrates at (i) a typical potential profile in a CCD channel along the lines A–B of FIG. 4A and at (ii) a typical potential profile across the CCD channel along the lines C–D of FIG. 4A.
Figure 4B:
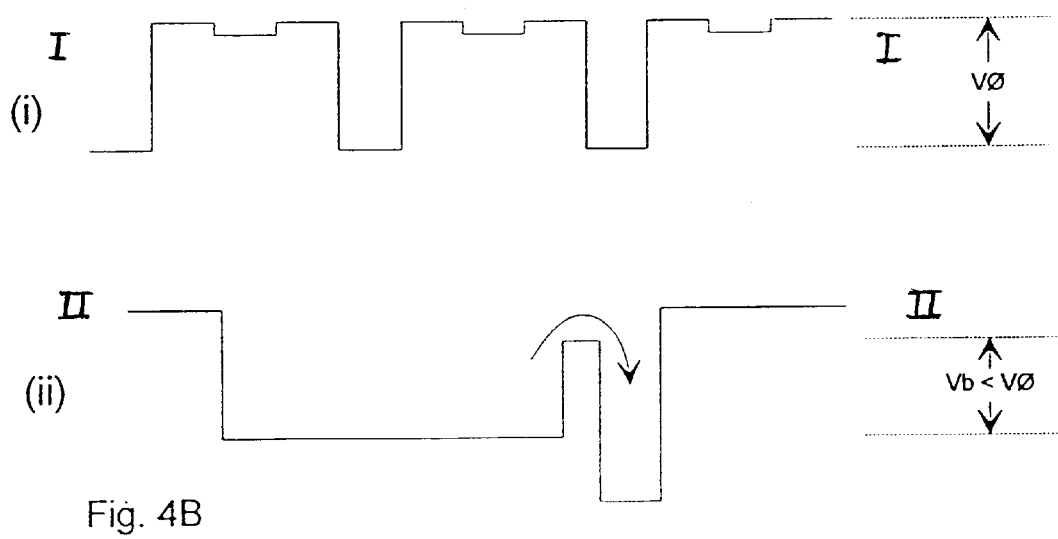

With reference to FIGS. 4A and 4B in another embodiment of the invention, a signal limiting structure is included to accommodate excess charge in the multiplication register 15 which might otherwise spread into adjacent register elements and degrade resolution. The multiplication register 15 is similar to that illustrated in FIG. 2 but in addition includes a barrier region 16 formed by ion implantation and a drain region 17. The barrier could alternatively be implemented by including a separate electrode, similar to a gated anti-blooming drain. FIG. 4B illustrates the potential profiles at a given time under electrodes of the multiplication register 15, with (i) showing variation of potential along the line A–B and (ii) along the line C–D. The barrier voltage $V_b$ is less than the depth $V_\phi$ of the potential well under the electrodes to which a normal amplitude clock pulse is applied so that any excess signal charge is collected in the drain region 17 as shown by the arrow.

Figure 5:
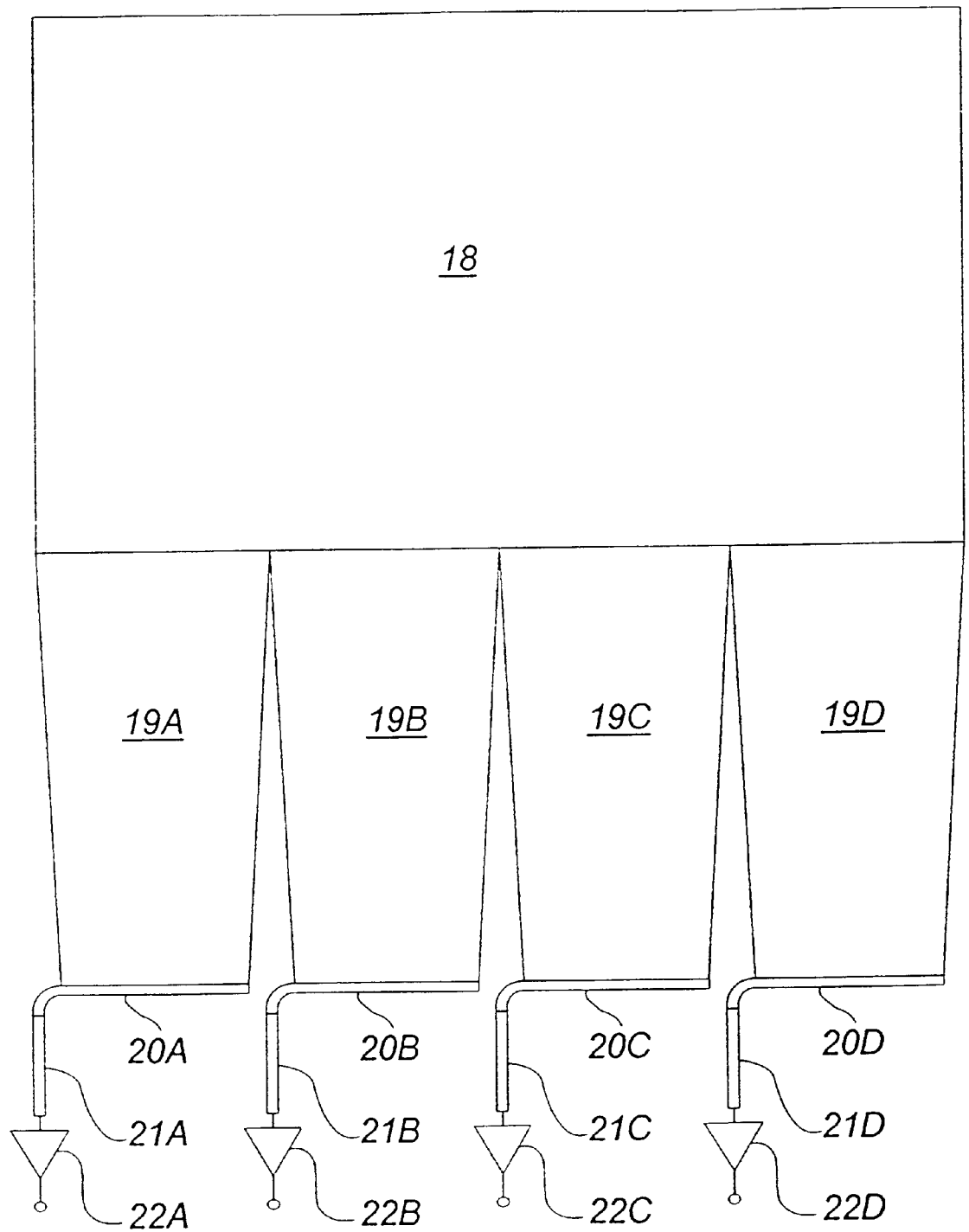
FIG. 5 schematically illustrates a CCD imager in accordance with the invention having a plurality of charge multiplication registers.

In the imager shown in FIG. 1, all of one row of signal charge is read out from the output register 4 into the multiplication register 5. In other arrangements, an additional multiplication register is included at the other end of the output register 4 together with its own charge detection circuit. In that case, charge may be read from one half of the output register 4 in one direction and from the other half in the opposite direction to the additional multiplication register. In other devices, more than one output register may be included and associated with its own multiplication register and charge detection circuit. Such an arrangement is schematically shown in FIG. 5. The image section 18 of the CCD imager is connected to four separate store sections 19A, 19B, 19C and 19D which are connected to respective different output read out registers 20A to 20D. Each read out register 20A to 20D is connected to a respective different multiplication register 21A to 21D the outputs of which are applied to charge detection circuits 22A to 22D. The multiplication registers 21A to 21D are controlled in accordance with the invention to produce gain of signal charge as required.

By applying particularly high electrical fields to the multiplication register of a CCD imager in accordance with the invention, it is possible to operate the CCD as a photon-counting device. The multiplication factor is controlled to be sufficient that the number of photons generating electron-hole pairs in each pixel may be unambiguously determined by the signal charge detected at the output.

We claim:

1. A CCD imager comprising: an image area at which signal charge is generated in response to incident radiation; an output register which receives signal charge from said image area; a separate multiplication register into which signal charge from said output register is serially transferred, said multiplication register including a plurality of elements;

and means for obtaining signal charge multiplication by transferring said signal charge through an electric field in the elements of said multiplication register.

2. An imager of claim 1 wherein the signal charge is transferred in series from said output register through each element of said multiplication register.

3. An imager of claim 1 wherein an electric field region for obtaining charge multiplication is produced in each element of said multiplication register.

4. An imager of claim 2 and wherein an electric field region for obtaining charge multiplication is produced in each element of said multiplication register.

5. An imager of claim 1 and including means for synchronizing a signal read-out from said multiplication register with the line timing of a television rate signal.

6. An imager of claim 1 wherein a number of elements of said multiplication register is approximately equal to an integral multiple of a number of elements of said output register.

7. An imager of claim 6, including means for synchronizing a signal read-out from said multiplication register with the line timing of a television rate signal.

8. An imager of claim 6 wherein the signal charge is clocked through said multiplication register at the same rate as the signal charge is clocked through said output register.

9. An imager of claim 1 wherein the signal charge is clocked through said multiplication register at the same rate as the signal charge is clocked through said output register.

10. An imager of claim 1 wherein the amount of signal charge multiplication is controlled by controlling the amplitude of one or more drive pulses applied to said multiplication register to transfer signal charger therethrough.

11. An imager of claim 10 wherein the amount of signal charger multiplication is controlled by controlling the level of one more dc potentials applied to said multiplication register.

12. An imager of claim 1 wherein the amount of signal charge multiplication is controlled by controlling the level of one or more dc potentials applied to said multiplication register.

13. An imager of claim 1 wherein the charge capacity of one or more of the elements of said multiplication register is larger than that of elements of said output register.

14. An imager of claim 1 including signal limiting means to prevent excess signal charge from an element of said multiplication register spreading into another element of said multiplication register.

15. An imager of claim 1 having a plurality of output registers associated with respective ones of a plurality of multiplication registers.

16. An imager of claim 1 including means for producing signal charge multiplication sufficient to achieve photon-counting.

17. An imager of claim 1 including an automatic gain circuit to control the amount of signal charge multiplication.

18. A CCD imager comprising: an image area at which signal charge is generated in response to incident radiation; a plurality of output registers which receive signal charge from said image area; a plurality of multiplication registers into which signal charge from respective ones of said plurality of output registers is transferred; and means for obtaining signal charge multiplication by transferring said signal charge through an electric field region in the elements of said plurality of multiplication registers.

19. An imager of claim 18 wherein signal charge is transferred in series from one of said plurality of output registers through each element of a respective one of said plurality of multiplication registers.

20. An imager of claim 18 wherein the electric field region for obtaining charge multiplication is produced in each element of at least one of said plurality of multiplication registers.

21. An imager of claim 18 wherein a number of elements of at least one of said multiplication registers is approximately an integral multiple of a number of elements of a respective one of said plurality output registers.

22. An imager of claim 18, including means for synchronizing signal read-out from said plurality of multiplication registers with the line timing of a television rate signal.

23. An imager of claim 18 wherein the signal charge is clocked through said plurality of multiplication registers at the same rate as the signal charge is clocked through respective ones of said plurality output registers.

24. An imager of claim 18 wherein the amount of signal charge multiplication is controlled by controlling the amplitude of one or more drive pulses applied to at least one of said plurality of multiplication registers to transfer signal charge therethrough.

25. An imager of claim 18 wherein the amount of signal charge multiplication is controlled by controlling the level of one or more dc potentials applied to at least one of said plurality of multiplication registers.

26. An imager of claim 1, wherein the multiplication register has an input receiving the serial transfer from the output register and an output, the elements of the multiplication register near the output having a larger charge capacity than those elements near the input.

27. An imager of claim 1, wherein the multiplication register extends from the output register along a longitudinal axis of the output resister.

28. An imager of claim 18, wherein the multiplication register extends from the output register along a longitudinal axis of the output resister.

29. A CCD imager, comprising:
an image area at which signal charge is generated in response to incident radiation;
an output register receiving the signal charge from the image area;
a separate multiplication register having an input that receives the signal charge from the output register and an output, the multiplication register including a plurality of elements, the elements near the output have a larger charge capacity than those elements near the input; and
means for obtaining signal charge multiplication by transferring the signal charge through an electric field in the elements of the multiplication register.

30. A CCD imager, comprising:
an image area at which signal charge is generated in response to incident radiation;
an output register receiving the signal charge from the image area;
a separate multiplication register that receives the signal charge from the output register, the multiplication register including a plurality of elements that extend from the output register along a longitudinal axis of the output resister; and
means for obtaining signal charge multiplication by transferring the signal charge through am electric field in the elements of multiplication register.

31. An imager of claim 1 wherein the multiplication register is separate from the image area.

* * * * *

UNITED STATES PATENT AND TRADEMARK OFFICE
CERTIFICATE OF CORRECTION

PATENT NO.   : 6,444,968 B1
DATED        : September 3, 2002
INVENTOR(S)  : David James Burt et al.

It is certified that error appears in the above-identified patent and that said Letters Patent is hereby corrected as shown below:

<u>Title page,</u>
Below Item [76] Inventors, insert Item [73], Assignee as follows:

-- [73] Assignee:   EEV Limited, United Kingdom --.

Signed and Sealed this

Sixth Day of May, 2003

JAMES E. ROGAN
*Director of the United States Patent and Trademark Office*